United States Patent

Billman et al.

(10) Patent No.: US 6,663,401 B2
(45) Date of Patent: Dec. 16, 2003

(54) ELECTRICAL CONNECTOR

(75) Inventors: Timothy B. Billman, Dover, PA (US); Eric D. Juntwait, Hummelstown, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/226,848

(22) Filed: Aug. 22, 2002

(65) Prior Publication Data

US 2003/0003803 A1 Jan. 2, 2003

Related U.S. Application Data

(63) Continuation-in-part of application No. 10/152,936, filed on May 21, 2002, which is a continuation-in-part of application No. 09/746,088, filed on Dec. 21, 2000, now Pat. No. 6,390,857.

(51) Int. Cl.$^7$ ............................................. H01R 13/648
(52) U.S. Cl. ...................................... 439/76.1; 439/701
(58) Field of Search ................................ 439/680, 687, 439/701, 718, 79, 377, 55, 59, 636, 637, 61, 62, 64, 65, 67, 74, 77, 76.1, 608

(56) References Cited

U.S. PATENT DOCUMENTS

| | | | |
|---|---|---|---|
| 6,168,469 B1 * | 1/2001 | Lu | 439/608 |
| 6,171,115 B1 * | 1/2001 | Mickievicz et al. | 439/76.1 |
| 6,267,604 B1 * | 7/2001 | Mickievicz et al. | 439/79 |
| 6,354,877 B1 * | 3/2002 | Shuey et al. | 439/608 |
| 6,375,508 B1 * | 4/2002 | Pickles et al. | 439/608 |
| 6,390,857 B1 * | 5/2002 | Pickles et al. | 439/680 |
| 6,471,549 B1 * | 10/2002 | Lappohn | 439/608 |
| 6,500,029 B2 * | 12/2002 | Nitta | 439/608 |
| 6,506,076 B2 * | 1/2003 | Cohen et al. | 439/608 |

* cited by examiner

Primary Examiner—Ross Gushi
(74) Attorney, Agent, or Firm—Wei Te Chung

(57) ABSTRACT

An electrical connector (1) mounted on a daughter backplane circuit board is used to mate with a complementary connector (2) mounted on the primary backplane circuit board. The connector (1) includes a top housing (11) and a bottom housing (12) and inner circuit boards (3) installed therebetween. Rows of paired signal contacts (5) and grounding plates (4) are arranged in an alternating sequence within the bottom housing (12) to engage with the inner circuit boards (3). Two projections (37) extend out of edges of every inner circuit board (3) so that the inner circuit board (3) can be positioned after the projections (37) are inserted into corresponding holes (15, 19) formed respectively in the top and bottom housing (11, 12) when the connector (1) is assembled.

9 Claims, 8 Drawing Sheets

ELECTRICAL CONNECTOR

CROSS REFERENCE TO RELATED APPLICATIONS

This application is a continuation-in-part (CIP) of U.S. patent application Ser. No. 10/152,936, filed on May 21, 2002, entitled "Electrical Connector", which is a continuation-in-part (CIP) of U.S. patent application Ser. No. 09/746,088, filed on Dec. 21, 2000, entitled "Electrical Connector Having Leading Cap for Facilitating Printed Circuit Board in the Connector into a Mating Connector", now issued as U.S. Pat. No. 6,390,857 on May 21, 2002, and is related to U.S. patent application Ser. No. 09/749,086, entitled "Electrical Connector Assembly Having the Same Circuit Boards Therein", filed on Dec. 26, 2000, now issued as U.S. Pat. No. 6,375,508 on Apr. 23, 2002, all of these applications being assigned to the same assignee of this patent application. The disclosure of the above identified applications is incorporated herein by reference.

BACKGROUND OF THE INVENTION

1. Field of the Invention

The present invention is related to a connector assembly with multiple rows and columns of conductive elements, especially to a connector assembly having a plurality of inner circuit boards mounted therein to form needed conductive paths to connect with a daughtercard and a backplane assembly.

2. Description of the Related Art

Most of backplane assemblies used in a computation or communication device have at least one primary circuit board with the basic specialized function which need to combine with other functional electronic extension cards/circuit boards so that the whole assembly they belong to can achieve diverse, improvable and massively repeated performance. Therefore, a plurality of interconnection devices like board-to-board electrical connectors used to connect the primary circuit board and other extension circuit boards/cards then are broadly adopted in the backplane assembly. Due to multiple rows and columns of conductive elements or contacts such an interconnection device may have, the perfect and cheap way for manufacturing, assembling and mounting the interconnection device is difficult to find out or achieve at present. Originally, the conventional backplane connector design uses a large insulative housing with a plurality of holes for the inserted installation of contacts. However, this kind of designs is not good and convenient enough for the high density and small-pitched requirement of an interconnection device recently. Specially, the complicated and necessary assembling process causes the high cost of the final product and time consuming. Therefore, it is known to provide each column of contacts as a separate module that includes one vertical array of contacts having an overmolded carrier. Multiple modules then are integrally installed in a connector housing to form a complete connector. U.S. Pat. Nos. 5,066,236 and 5,664,968 both show such a connector structure. Generally, all of the modules in such a connector are substantially identical. But different types of modules sometimes are needed in a connector in order to accommodate different electrical characteristics of signals through the connector. Besides, due to continuing trends toward miniaturization and improved electrical performance by the electronics industry, requirements for greater conductive element/contact density and higher electrical speeds are constantly being promulgated. These requirements lead to design conflicts, especially when electrical speeds are in the range of approximately 500 megahertz and above, due to the fact that increasing the contact density places the conductive elements/contacts in closer proximity to each other, thereby leading to crosstalk between neighboring conductive elements/contacts in different signal pairs. Thus, as introduced in U.S. Pat. No. 5,104,341 and 6,299,484, some ground reference means are disposed between every two signal modules to reduce crosstalk induced therebetween.

However, new overmolded technology developing recently shows possibly high production cost may be caused because more and more minimized conductive elements should be assembled together in a small-sized plastic block. It is much difficult to position these high density arranged conductive elements in a overmolding mold due to the high plastic injection pressure and scarce space between these elements. A precise and complicate mold that usually costs high is needed to achieve the production. Therefore, some other substitutes like a small circuit board are considered. Robin et al. U.S. Pat. No. 4,571,014 and Paagman U.S. Pat. No. 5,924,899 both show a plurality of inner circuit boards installed inside a backplane connector. Each conductive path on these circuit boards can be thinner and closer to each other than a separate stamping contact of the overmolded module though a perfect small circuit board costs high too. An extra solder tail or a mating contact for every conductive path on the circuit board is needed and most of them should be soldered onto one of the circuit boards first before the circuit board is installed into the backplane connector. And the solder joints of every circuit board may be hurt or broken when the backplane connector is mated because the mating force applied on every circuit board may be transferred to its solder joints right away. More fixing or positioning features have to be considered and adopted to overcome this situation and result in a higher product cost.

SUMMARY OF THE INVENTION

Therefore, an object of the present invention is to provide an electrical connector used in a backplane application with inner circuit boards installed therein to achieve a better electrical performance by using a method of assembling and fastening the inner circuit boards and other parts of the connector along a direction vertical to its mating direction so that they can avoid any unnecessary displacement during the processes of mating or board-mounting.

Another object of the present invention is to provide an electrical connector having effective and useful fixing mechanism to fasten parts, like inner circuit boards, inside the connector, which still contributes easily assembling of parts and functions without any complicated structure.

Another object of the present invention is to provide an electrical connector having larger tolerance to undesired mating displacement of inner circuit boards installed therein and maintaining better electrical performance in a vibration circumstance.

To obtain the above objects, an electrical connector in accordance with the present invention includes a top housing and a bottom housing to form a receiving space therebetween. A plurality of parallel partitions extends respectively from the inner face of the top and bottom housing and protruding into the receiving space. Inner circuit boards with traces thereon are respectively inserted and stay in the space between every two partitions of either the top housing or the bottom housing. Besides, pairs of signal contacts and grounding plates are installed in the bottom housing. The signal contact pairs are respectively received inside every partition in one row and exposed their engaging arms out of one surface of the partition while each grounding plate is seated and abutting against the other surface of every partition respectively. Each of the inner circuit boards has pairs of signal traces on one surface and a grounding layer formed on the other so that they can be engaged with the signal contact pairs and grounding plates installed in the bottom housing when the connector is assembled.

Specially, compressible ridges are disposed on the inner top face of the top housing between every two partitions in spaced-apart relationship. And holes are formed on the top housing and the bottom housing respectively and can be treated as a pair because each hole on the top housing and its related one on the bottom housing are located in the same plane right between two spaced-apart partitions. Two projections corresponding to the holes extend out of edges of every inner circuit board and are inserted into the holes when the connector is assembled. Meanwhile, a plurality of stops abutting against the inner bottom face of the bottom housing is stamped out of the surface of each grounding plate. Every one of the inner circuit board is rested on the top of the stops of a corresponding grounding plate and is pressed by the compressible ridges of the top housing in order to be positioned when the top and bottom housings are assembled as a whole connector along the direction parallel to the mating face of the connector. Therefore, the inner circuit boards can be held in position inside the connector though they are not actually fixed therein. The effective engagement between the boards and conductors in the bottom housing will be continuously maintained by projections of inner circuit boards and holes of the housings, and a flexible mechanism including ridges cooperating with stops of grounding plates when the connector is mated with its complementary connector. And due to the separable engagement between the inner circuit boards mostly received in the top housing and the conductors, pairs of signal contacts and grounding plates, received in the bottom housing and the fact of the top housing being removably latched above the bottom housing, the inner circuit boards can be dismantled and replaced anytime even though the connector is mounted on a printed circuit board and no special treatment or process like reflow is needed.

Furthermore, the projections of every inner circuit board are inserted into the holes of the top and bottom housings respectively along a direction parallel to the mating face of the connector, which is the same direction as the assembling direction of the top and bottom housings, so that the top housing is latched on the bottom housing as well as all of the inner circuit boards are installed and fixed inside the connector at the same time. And projections of the inner circuit boards will stop any unnecessary movement of the inner boards along the mating direction when the connector is mated with its complementary connector.

Other objects, advantages and novel features of the invention will become more apparent from the following detailed description of the present embodiment when taken in conjunction with the accompanying drawings.

DESCRIPTION OF THE PREFERRED EMBODIMENT

Figure 8:
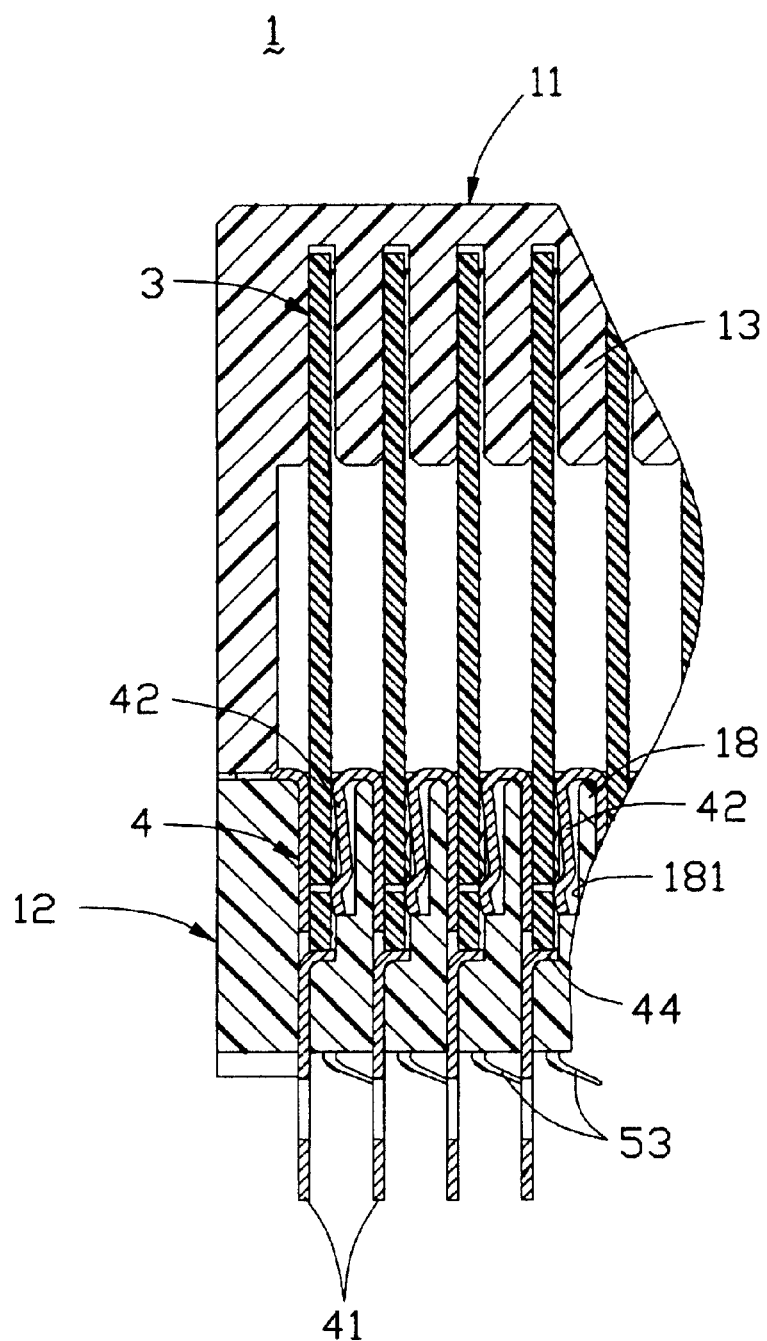
FIG. 8 is a partially sectional view of the electrical connector shown in FIG. 4 and FIG. 5 along the 8—8 line showing one kind of the electrical conductors, grounding plates, engaged with their neighboring inner circuit boards.
Figure 9:
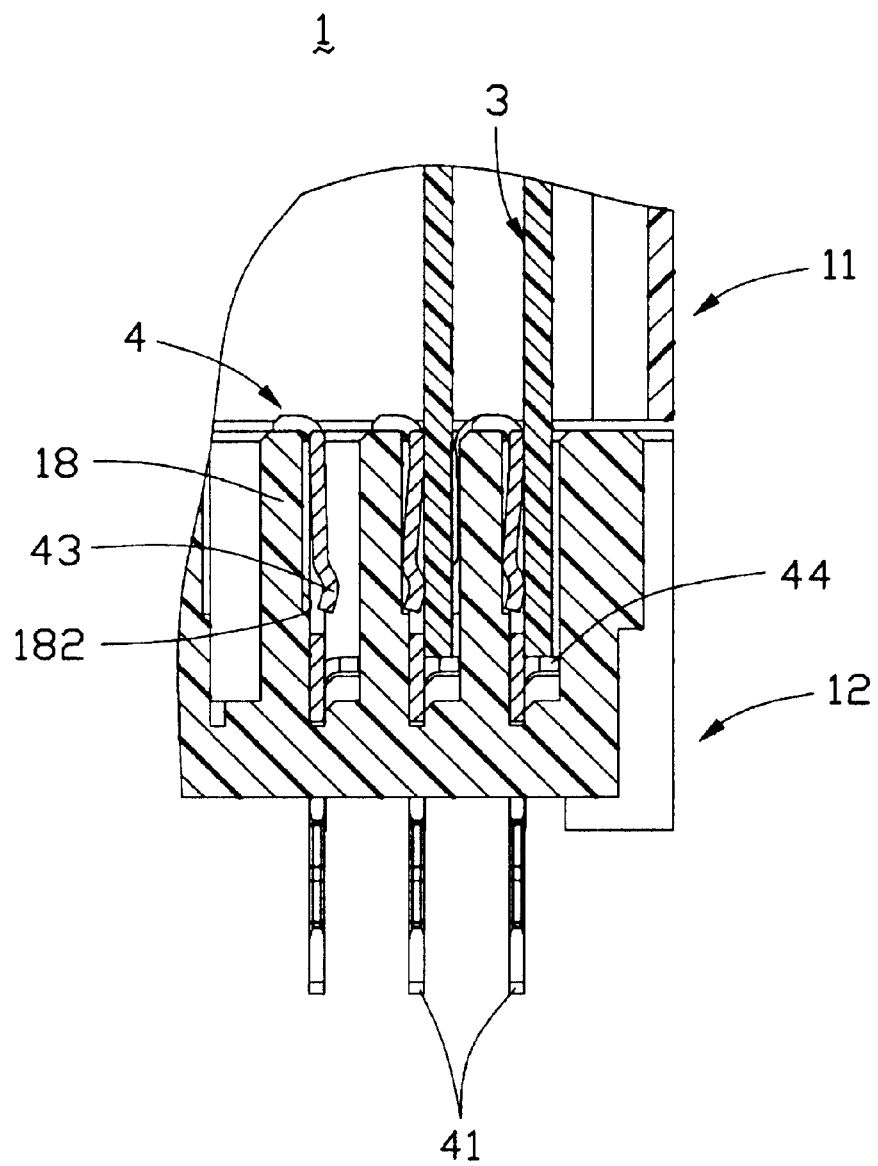
FIG. 9 is a partially sectional view of the electrical connector shown in FIG. 2 showing the engagement of some grounding plates and their neighboring inner circuit boards on the other side thereof without any signal contact installed.

Referring to FIGS. 1 to 3 and 6, the electrical connector 1 in accordance with the present invention is shown mating with its complementary connector 2. The receptacle type electrical connector 1 includes a top housing 11 and a bottom housing 12 being assembled together to form a receiving space therebetween. The top housing 11 has a top wall, a rear wall and two sidewalls extending from the edges of the top wall partially surrounding the receiving space. A plurality of partitions 13 are formed extending from the inner face of the top wall and protruding into the receiving space. These partitions 13 are parallel arranged and spaced from each other. Several compressible ridges 14 are disposed on the inner face of the top wall between every two partitions 13 in spaced-apart relationship. Each of these ridges 14 can extend from one partition to the other perpendicular to surfaces of these two partitions or at a predetermined angle. A row of holes 15 are formed on the top wall of the top housing 11 and each of these holes 15 is disposed on the portion between every two parallel partitions 13. And a pair of locking arms 16 extends from the lower edge of the rear wall and two sidewalls respectively. The bottom housing 12 has a bottom wall, rear wall and two sidewalls corresponding to the top housing 11 to enclose the receiving space together. Grooves 17 each having a step disposed therein are formed on the outer surface of the rear wall and sidewalls of the bottom housing 12 corresponding to locking arms 16 of the top housing 11 in order to lock the top and bottom housing 11, 12 together when each of the locking arm 16 moves into one of the grooves 17. A plurality of partitions 18 are disposed extending from the inner face of the bottom wall of the bottom housing 12 and each partition 18 is located basically in the same vertical plane as the one of its corresponding partition 13 of the top housing 11. Referring to FIGS. 8 and 9, two rows of recesses 181, 182 are disposed respectively on two surfaces of the partition 18 and recesses 181 on one surface are formed deeper than others 182 on the other surface. A row of holes 19 is disposed on the bottom wall of the bottom housing 12 corresponding to the holes 15 of the top housing 11 and each of these holes 19 is located in the same vertical plane as its corresponding hole 15 of the top housing 11 is.

Referring particularly to FIGS. 2 and 7 to 9, two kinds of electrical conductors are received in the bottom housing 12.

One kind of the conductors, pairs of signal contacts 5, are installed in the bottom housing 12 and resting in every partition 18 in one row. Each signal contact 5 comprises a retention portion 52 used to fix the whole signal contact 5 in its resting partition 18, an engaging arm 51 flexibly extending from the retention portion 52 upwards and having an contacting end disposed beyond one surface of the partition 18, and a tail portion 53 extending from the retention portion 52 and extending out of the lower face of the bottom housing 12 in order to be compressively engaged with conductive traces of the daughter backplane circuit board (not shown). The other conductors, however, are grounding plates 4 seated on every partition 18 respectively. Each grounding plate 4 includes a plate-like base abutting against one surface of a partition 18 with a plurality of press-fit tails 41 extending from the lower edge of the base. These tails 41 and tail portions 53 of signal contacts 5 are alternately arranged along the same line below every partition 18 to avoid short circuit happening between these two kinds of conductors 4, 5. Every tail 41 of grounding plates 4 is pressed fit in a corresponding hole on the daughter backplane circuit board when the receptacle connector 1 is mounted thereon. Thus, the whole connector 1 can be held in position on the daughter backplane circuit board by these press-fit tails 41 and signal contacts 5 gain enough normal compressing force to have their compressive tail portions 53 effectively engaged with pads connecting to traces on the daughter circuit board. Besides, several flexible beams 42 extend from the top edge of every grounding plate 4 and are bent abutting against the other surface of the partition 18. Each flexible beam 42 exposes its end beyond the partition 18 surface though most portions of the flexible beam 42 are received in a corresponding recess 181 disposed thereon. On the base surface of each grounding plate 4, lanced arms 43 are punched out therefrom and located next to the shallower recesses 182 formed on the surface of the partition 18 where the base of the grounding plate 4 abuts. The lanced arms 43 then gain enough space to move flexibly when they are engaged with any inner circuit board 3. Meanwhile, a plurality of stops 44 is stamped out of the base surface of each grounding plate 4. These stops 44 can be shaped as a vertically extending tab partially seated on the inner face of the bottom wall of the bottom housing 12 or a vertically risen shear-out protrusion with top and bottom sheared edges. Every one of the inner circuit board 3 is rested on the top of the flexible stops 44 of a corresponding grounding plate 4 in order to be positioned vertically when these parts are assembled.

Figure 1:
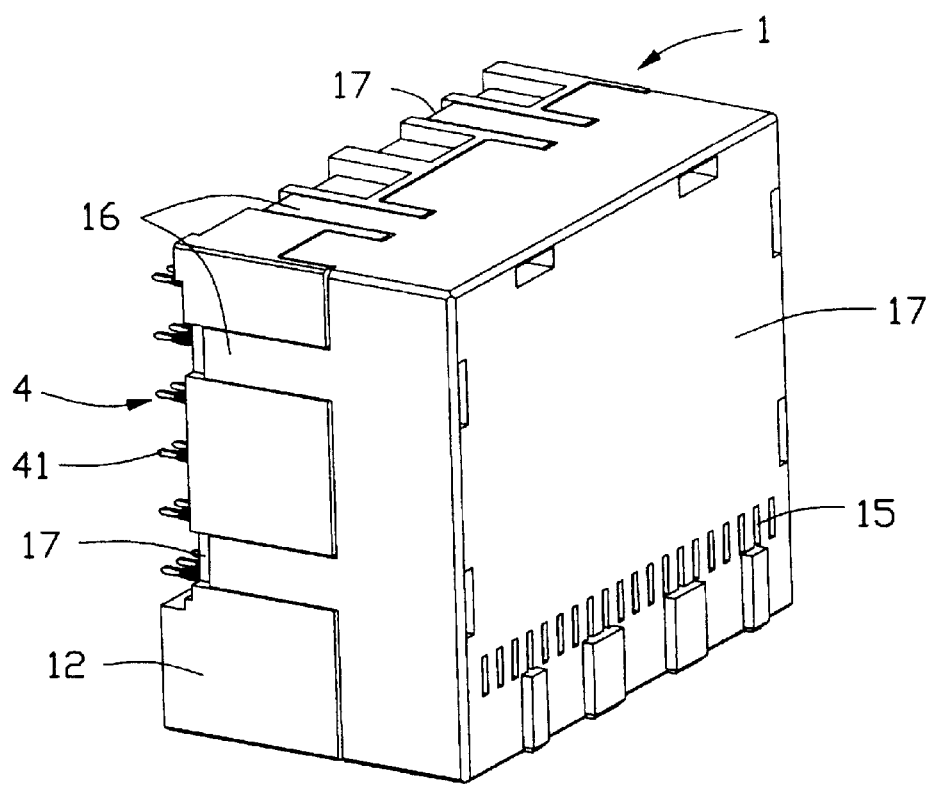
FIG. 1 is a perspective view of an electrical connector and its mating male connector in accordance with the present invention.
Figure 1:
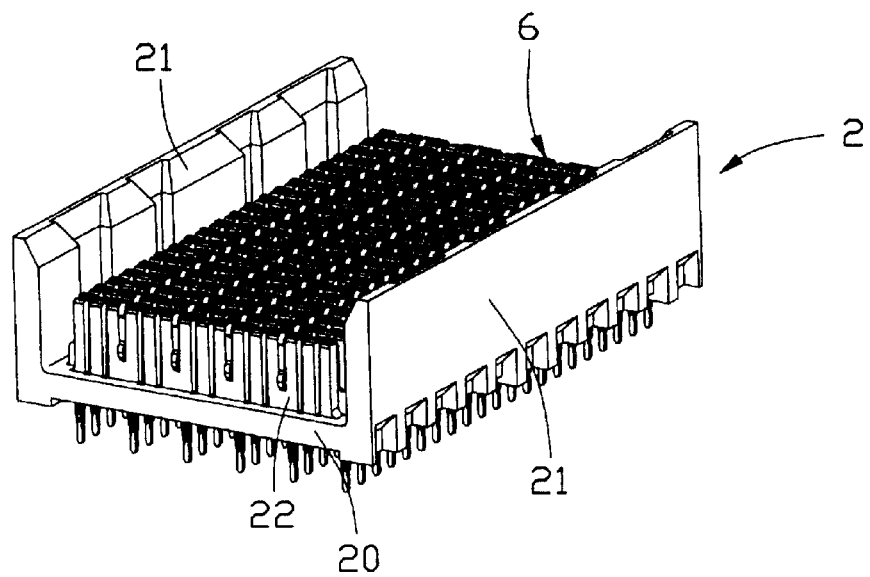
Figure 2:
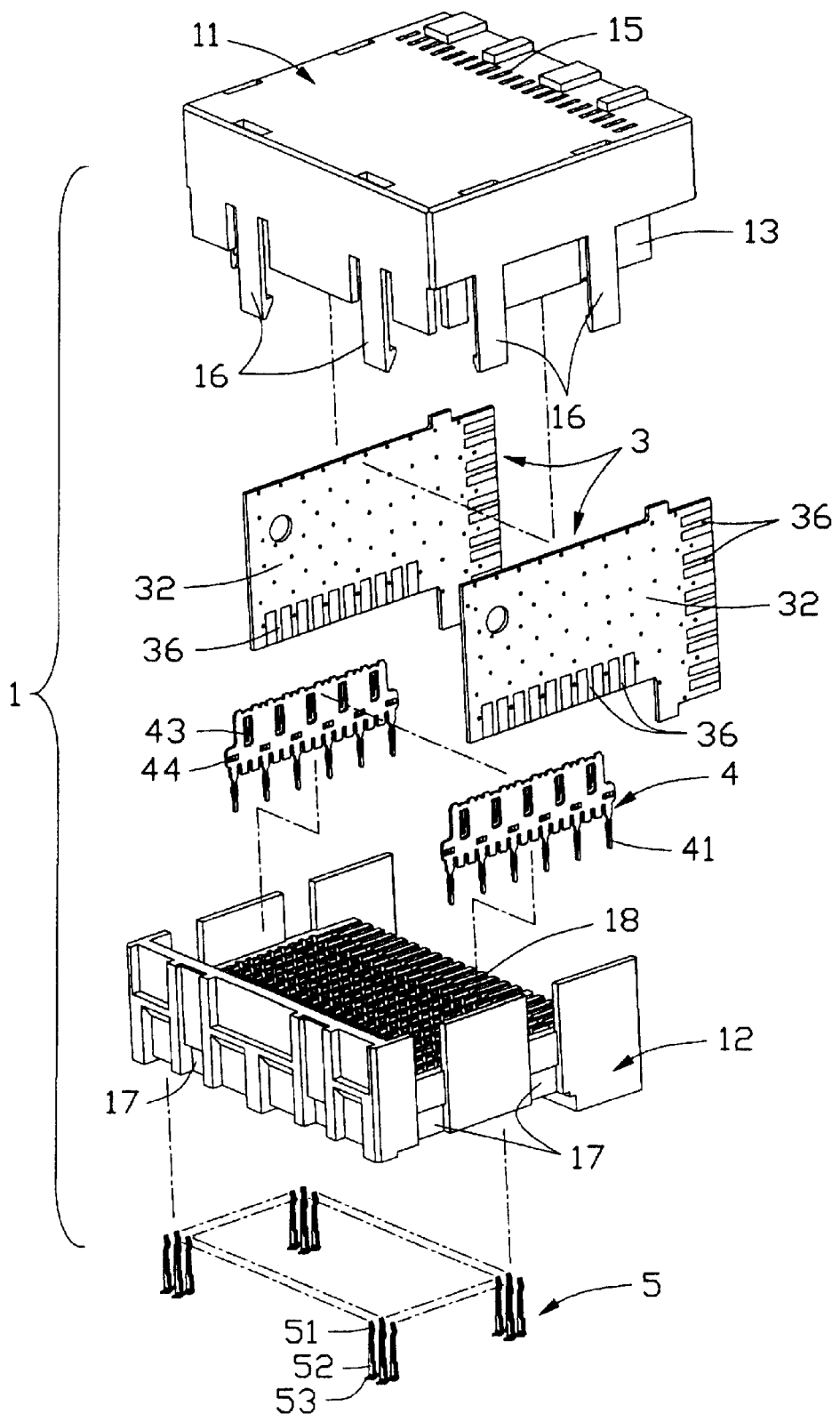
FIG. 2 is an explored view of the electrical connector as shown in FIG. 1 in accordance with the present invention.
Figure 3:
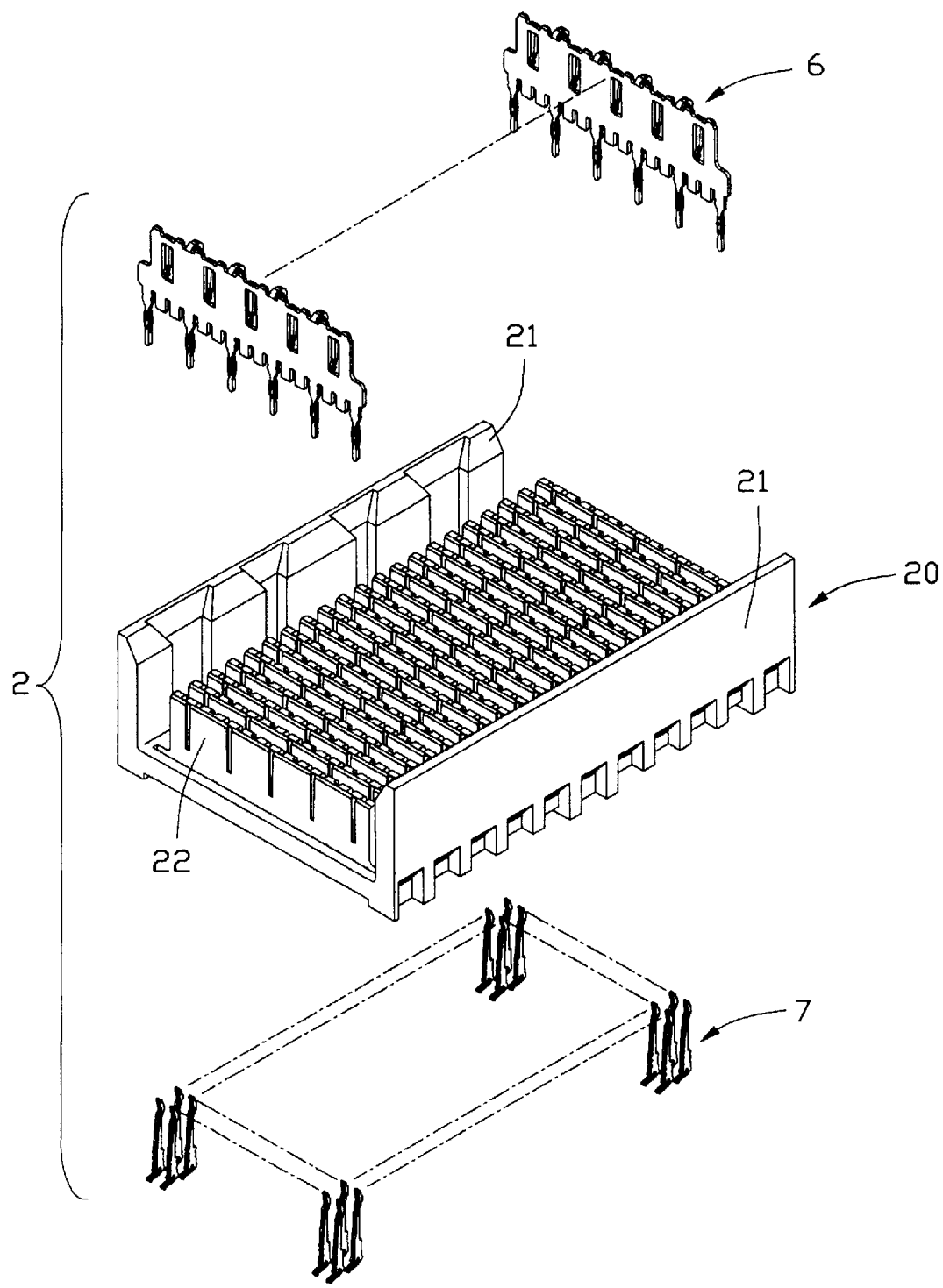
FIG. 3 is an explored view of the mating male electrical connector as shown in FIG. 1 in accordance with the present invention.
Figure 4:
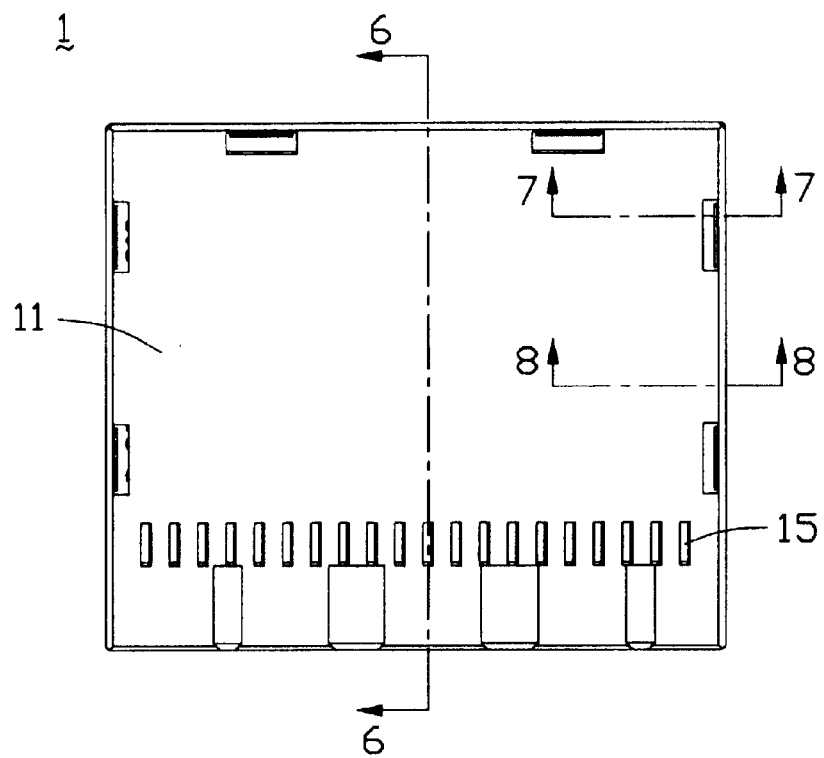
FIG. 4 is a top side view of the electrical connector as shown in FIG. 2.
Figure 5:
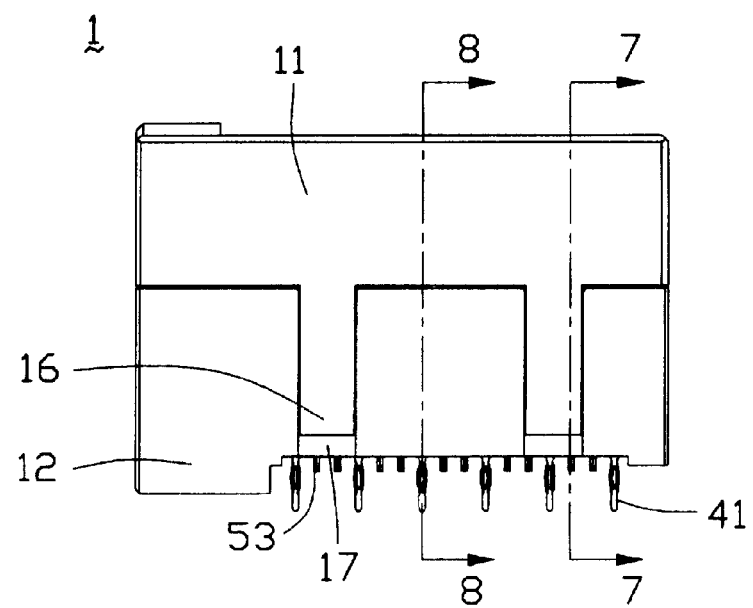
FIG. 5 is a lateral side view of the electrical connector as shown in FIG 2.
Figure 6:
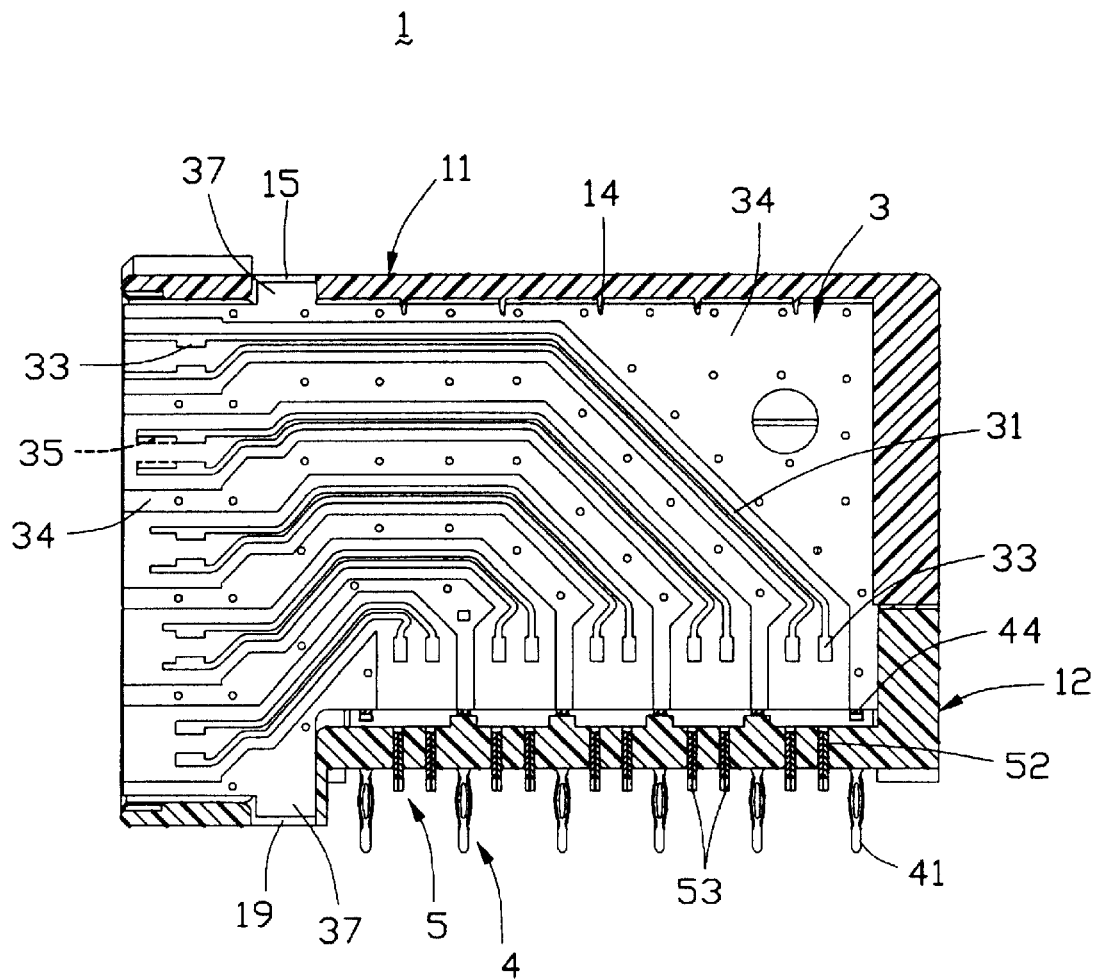
FIG. 6 is a sectional view of the electrical connector showing an inner circuit board installed therein along the 6—6 line in FIG. 4.
Figure 7:
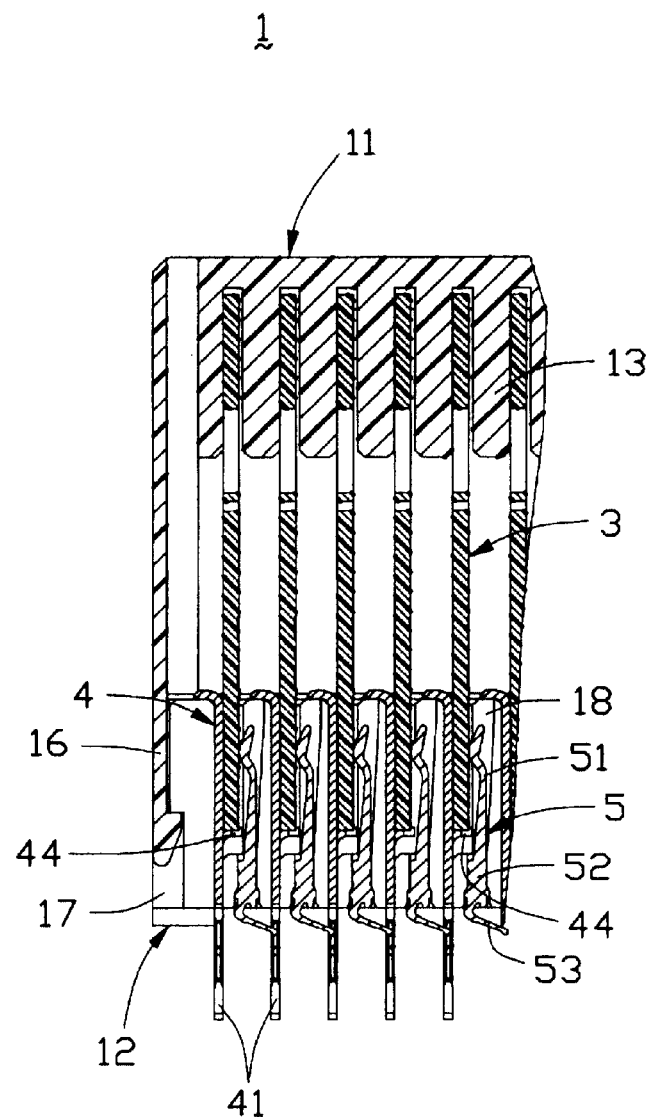
FIG. 7 is a partially sectional view of the electrical connector showing the engagement between electrical conductors and the inner circuit boards inside the connector along the 7—7 line in FIG. 4 and FIG. 5.

Referring to FIGS. 2 and 6, a plurality of inner circuit boards 3, used as main conductors in the connector 1, are received in the receiving space with portions of them resting between every two partitions 13 of the top housing 11 respectively. Every inner circuit board 3 has pairs of signal traces 31 on one surface and a grounding layer 32 formed on the other surface. Basically the signal trace pairs 31 are parallel arranged and spaced apart from each other on the board surface and a grounding layer 34 is disposed on the board surface either between two neighboring signal pairs 31 or partially surrounding one signal pair 31. Each of signal traces of every pair 31 has pads 33 at its both ends. The pads 33 at one end of these signal traces 31 are aligned near a mating edge of the inner circuit board 3 in order to be engaged with the conductors received in the bottom housing 12. And the pads 33 at the other end of these signal traces 31 are aligned near another mating edge of the inner circuit board 3 used to mate with the complementary connector 2. These mating-use pads 33 all have a cut-off area 35 (shown one only by dash lines in FIG. 6) near the mating edge of the inner circuit board 3 in order to keep coincident impedance along the trace of a signal transmission path because the impedance of the transmission path varies when a pad 33 is always wider than its connected trace 31. Similarly, a cut-off area of the grounding layer 32 on the other side of the inner circuit board 3 neighboring any one of the pads 33 can affect the impedance of the signal transmission path by a similar coupling way in the substitutive method. And two rows of spaced trace ends 36 connecting to the grounding layer 32 are formed on the other board surface near either one mating edge of every inner circuit board 3 respectively. Two projections 37 extend out of the top and bottom edges of every inner circuit board 3 and are inserted in the holes 15, 19 of the top housing 11 and bottom housing 12 respectively in order to position the board 3 along the mating direction.

Referring to FIGS. 2 and 6 to 9, it is understandable, when the connector 1 is going to be assembled, the conductors including signal contact pairs 5 and grounding plates 4 of the bottom housing 12 are first installed therein. The signal contact pairs 5 are installed in every partition 18 of the bottom housing 12 and keep their engaging arms 51 partially exposed out of one surface of the partition 18. And each grounding plate 4 is installed abutting against the other surface of one partition 18 and its flexible beams 42 are hung down in the recesses 181 on the same exposing surface of the partition 18 as signal contacts 5. Then inner circuit boards 3 are respectively inserted into slots formed between every two partitions 18 and seated on stops 44 of the grounding plates 4 abutting against these boards 3 and the bottom of the slots. The engaging arm 51 of every signal contact 5 is then electrically engaged with the corresponding pad 33 of every signal trace pair 31 of one inner circuit board 3 while the flexible beams 42 of the grounding plate 4 installed on the same partition 18 as this contact 5 are electrically engaged with grounding layers 34 surrounding the signal trace pairs 31. And the lanced arms 43 of the same grounding plate 4 are electrically engaged with the trace ends 36 of the grounding layer 32 of a second inner circuit board 3 next to the previously mentioned one. Obviously, the distance between the engaging area of grounding layer 34 and the bottom edge of the inner circuit board 3 is different from the distance between the signal pads 33 and the same edge. Therefore, the insertion of each inner circuit board 3 into its related slot of the bottom housing 12 is easier due to smaller needed insertion (or engaging) force. Finally, the subassembly of inner circuit boards 3 and the bottom housing 12 is covered by the top housing 11 along the direction parallel to the mating face of the connector 1 with locking arms 16 of the top housing 11 sliding in the grooves 17 of the bottom housing 12 and being locked therein to put the two housing parts 11, 12 together. The upper portion of every inner circuit board 3 is received in the space between partitions 13 of the top housing 11. And the whole circuit board 3 is releasably kept in position by engaging with stops 44 of the grounding plate 4 at its bottom and compressible ridges 14 of the top housing 11 at its top to be prevented from excess moving along the circuit board surface. Two projections 37 of every inner circuit board 3 are movably received in hole 15, 19 of the top and bottom housing 11, 12 to prevent the board 3 from backward moving when the connector 1 is mated with its complementary connector 2. Surely the installation of the boards 3 is easy and convenient because the insertion direction of these projections 37 is same as the assembling direction of the top housing 11 and every inner circuit board 3.

Referring again to FIGS. 1 and 3, the complementary connector 2, a header one for the backplane assembly connection mostly mounted on the primary backplane circuit board, has a housing 20 with a bottom wall and two shrouds 21 vertically extending from the opposing sides of the bottom wall. A plurality of partitions 22 is integrally formed with the bottom wall and protrusively extending therefrom. These partitions 22 are parallel arranged and spaced apart from each other. Conductors, including grounding plates 6 and signal contacts 7, are installed onto/in partitions 22 of the complementary connector housing 20. Basically the structural feature or function of grounding plates 6 and signal contacts 7 of the complementary connector 2 is mostly identical to those conductors in the bottom housing 12 of the receptacle connector 1. And the structural features of every partition 22 same as the features of the partitions 18 of the bottom housing 12 are adopted too. Therefore, the producing cost of the complementary connector 2 can be reduced due to the duplicate parts of the receptacle connector 1. And most of the advantages mentioned above about the parts of the receptacle connector 1 can be achieved by the complementary connector 2 as well.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   a connector housing assembly being seated on a printed circuit board and having a mating face to mate with a complementary connector mounted on another printed circuit board, at least two separable and attachable parts forming the housing assembly;
   a plurality of inner circuit boards being received in the housing assembly and having traces thereon to transmit signals, a fixture mechanism being formed on each inner circuit board; wherein
      said fixture mechanism of every inner circuit board is engaged with one of the housing parts along a direction same as the assembling direction of the housing parts when the inner circuit boards are disposed inside the connector housing assembly so that said fixture mechanism functions holding the inner circuit board in position inside the connector housing assembly along a direction perpendicular to the mating face when the connector is mated with the complementary connector, wherein said fixture mechanism of every inner circuit board is two projections extending respectively from one of the top and bottom edges of the inner circuit board.

2. The electrical connector as recited in claim 1, wherein the housing parts formed the connector housing assembly are a top and a bottom housing assembled along a direction parallel to the mating face of the connector.

3. The electrical connector as recited in claim 2, wherein both of the top housing and bottom housing have a plurality of holes disposed corresponding to the projections of all of the inner circuit boards in order to engage with the projections respectively.

4. An electrical connector comprising:
   a connector housing having at least first and second separable housing parts and each housing part including electrical conductors installed therein, the conductors received in the first housing part being separably engaged with the conductors received in the second housing part; wherein
      the first housing part and the second housing part are assembled together to define a common mating face so that one kind of the conductors installed in the first and second housing parts is exposed on the mating face to mate with a complementary connector for further signal transmission.

5. The electrical connector as recited in claim 4, wherein said two housing parts are a top and a bottom housing assembled along a direction parallel to the mating face they define.

6. The electrical connector as recited in claim 5, wherein the conductors received in the top housing are a plurality of inner circuit boards with traces thereon, these inner circuit boards are parallel arranged and spaced apart from each other.

7. The electrical connector as recited in claim 6, wherein the conductors received in the bottom housing includes rows of signal contact pairs and grounding plates alternately arranged therein.

8. A connector assembly comprising:
   a header connector having a housing with a mating face and a plurality of conductors received therein;
   a receptacle connector having a matable housing adapted to mate with the header connector, a plurality of inner circuit boards being received the matable housing and each inner circuit board having a mating edge used to mate with the conductors of the header connector for signal transmission; wherein
      the matable housing has at least two parts and both of the them define commonly a mating face where the matable housing is mated with the header connector.

9. An electrical connector comprising:
   upper and lower housings stacked together,
   the upper housing defining along a front-to-back direction a plurality of first partitions with slots each formed between every adjacent two first partitions thereof,
   the lower housing defining along the front-to-back direction a plurality of second partitions with grooves each formed between every adjacent two second partitions thereof,
   the slots aligned with the corresponding grooves, respectively, in a vertical direction;
   upper portions and lower portions of a plurality of printed circuit boards received in the corresponding slots and grooves, respectively;
   first projection/hole mechanism being applied to said lower housing and the lower portions of the printed circuit boards to initially have the printed circuit boards assembled to the lower housing in a downward vertical direction and prevent the printed circuit boards from moving in the front-to-back direction relative to the lower housing; and
   second projection/hole mechanism applied to said upper housing and the upper portions of the printed circuit boards to successively have the upper housing assembled to the printed circuit boards in the same downward vertical direction and prevent the printed circuit boards from moving in the front-to-back direction relative to the upper housing, when said upper housing is assembled to the lower housing with the printed circuit boards sandwiched therebetween.

* * * * *